(12) United States Patent
McCarthy et al.

(10) Patent No.: US 7,494,920 B2
(45) Date of Patent: Feb. 24, 2009

(54) METHOD OF FABRICATING A VERTICALLY MOUNTABLE IC PACKAGE

(75) Inventors: Daniel McCarthy, Eagan, MN (US); Lakshman Withanawasam, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 388 days.

(21) Appl. No.: 11/250,687

(22) Filed: Oct. 14, 2005

(65) Prior Publication Data

US 2007/0090529 A1   Apr. 26, 2007

(51) Int. Cl.
*H01L 21/4763* (2006.01)

(52) U.S. Cl. ............... 438/629; 438/637

(58) Field of Classification Search ......... 257/780; 438/629, 637
See application file for complete search history.

(56) References Cited

U.S. PATENT DOCUMENTS

| | | | |
|---|---|---|---|
| 5,490,324 A * | 2/1996 | Newman ............ | 29/830 |
| 6,492,600 B1 | 12/2002 | Jimarez et al. | |
| 6,524,644 B1 | 2/2003 | Wengenroth | |
| 6,783,654 B2 | 8/2004 | Inoue et al. | |
| 2002/0006503 A1 | 1/2002 | Watanabe et al. ...... | 428/209 |
| 2002/0117753 A1 | 8/2002 | Lee et al. ............ | 257/758 |
| 2003/0011075 A1 | 1/2003 | Ohuchi et al. ........ | 257/774 |
| 2004/0094832 A1 | 5/2004 | Tao ................... | 257/698 |

OTHER PUBLICATIONS

CB Industry Links, printed from the World Wide Web on Nov. 1, 2004, < http://dcchapters.ipc.org/html/pwblinks.htm>, p. 20.
Stafstrom, Eric, et al., "Reducing Solder Voids With Copper-Filled Microvias," Circuits Assembly, Apr. 2003, pp. 22-24.
European Search Report for 06122283.2-1528 dated Jan. 23, 2008.

* cited by examiner

*Primary Examiner*—Roy K Potter
(74) *Attorney, Agent, or Firm*—McDonnell Boehnen Hulbert & Berghoff LLP

(57) ABSTRACT

A method of fabricating a vertically mountable integrated circuit (IC) package is presented. An integrated circuit is mounted on a printed circuit board (PCB) and electrically coupled to a bond pad on the PCB. The bond pad is coupled with a via that is embedded in the PCB. The IC, the bond pad, the via, and a portion of the PCB are singulated in order to create a vertically mountable IC package. The via is cut through cross-sectionally during singulation so as to expose a portion of the via and thereby provide a mountable area for the IC package. The IC package may be encapsulated or housed in a dielectric material. In addition, the via may be treated with a preservative or other s-uitable electroless metal plating deposition that prevents oxidation and promotes solderability.

18 Claims, 5 Drawing Sheets

METHOD OF FABRICATING A VERTICALLY MOUNTABLE IC PACKAGE

FIELD

The present invention relates generally to the field of integrated circuit packages and more particularly to a method of fabricating a vertically, or perpendicularly, mounted integrated circuit package.

BACKGROUND

A variety of packaging techniques are offered today for integrated circuits (ICs). Packaging an integrated circuit allows it to be mountable to a circuit board, and more particularly a printed circuit board (PCB). In addition, packaging allows an IC to be electrically isolated from other IC packages on a PCB. The packaging itself also provides a measure of protection against exposure to direct physical contact with the IC during assembly and operation.

Packaged ICs are available in a variety of packaging schemes that include a Dual Inline Package (DIP), Small Outline Integrated Circuit package (SOIC), Thin Shrink Small Outline Package (TSSOP), or Shrink Small Outline Package (SSOP) to name a few. These packages include interconnects that are coupled with an IC. The IC itself is surrounded, housed, molded, or encapsulated in a dielectric material such as plastic or ceramic. A DIP encapsulated in plastic may be referred to as a Plastic Dual Inline Package (PDIP). Alternatively, if a DIP is encapsulated in a ceramic material it may be referred to as a Ceramic Dual Inline Package (CDIP).

An example DIP 10 is illustrated in FIG. 1a. DIP 10 includes an IC 12 and a dielectric housing 14. The IC 12 is laterally mounted within the dielectric housing 14. Upon mounting the IC 12, the dielectric housing 14 is sealed. Prior to the dielectric housing 14 being sealed, however, conductive interconnects, such as interconnect 16, made up of a material such as aluminum or copper are wire bonded to the IC 12 via wire and bump bonds 20.

The profile of DIP 10 is illustrated in FIG. 1b. DIP 10 is offset from a PCB 24 by an offset height 26. One drawback to DIP 10 is that its offset height 26 may not be suitable for modem electronics. Many modem electronics devices, such as cell-phones and personal digital assistants (PDAs), have stringent offset height requirements for IC packages. Primarily these stringent offset height requirements are due to the drive to make modem electronic devices more compact. By minimizing the offset height of IC packages, a PCB and its mounted IC packages become more compact and thereby make an electronic device more compact.

One IC package that is capable of being more compact is an SOIC package. One such SOIC package 28 is illustrated in FIG. 1c. The interconnects, such as interconnect 30, in this configuration allow the SOIC package to be mounted closer to the PCB 24, thereby reducing the offset height 32. One problem still inherent to this configuration is that a layer of dielectric material 34 still contributes to the offset height 32.

Additionally, another problem associated with conventional IC packages is that they are not easily vertically, or perpendicularly mountable. One application that some modem electronic devices include is compassing. These compassing applications use axis sensors to sense a magnetic field. X and Y-axis (or 2-axis) magnet field sensors may be placed laterally in an IC package (and in turn a PCB) and operate appropriately. X, Y, and Z-axis (or 3-axis) sensors, however, require that one of the sensors be orthogonally placed in relation to the other two sensors.

When a conventional third axis of a 3-axis sensor is mounted, it is difficult to meet the stringent offset height requirement that modem electronic devices require. The offset height of the third axis sensor is increased because the IC and the IC package is mounted perpendicularly, the interconnects are not easily bondable to a PCB, and the dielectric housing contributes to the offset height.

Therefore, an IC package is presented that allows an IC within an IC package to be mounted perpendicularly and minimizes the offset height of the IC package.

SUMMARY

A method of fabricating a vertically mountable integrated circuit (IC) package is presented.

The method includes the steps of etching and depositing a via through a copper clad printed circuit board (PCB). The PCB is made of a dielectric material such as Flame Retardant, type 4, (FR-4). A bond pad is created in the copper cladding that is in physical contact with the via. An integrated circuit (IC) is then wire and bump bonded to the bond pad and mounted on the PCB. At this point, the IC, bond pad, and wire bond may be encapsulated in a dielectric surrounding or housing. Subsequent to the IC being wire and bump bonded and mounted, the via, IC, bond pad, and a portion of the dielectric layer are singulated. The via is singulated in a cross-sectional manner, so that upon completion of the singulation, a portion of the via has an exposed surface area. This surface area is then mountable to another PCB.

In another example, a third axis-of a 3-axis sensor is fabricated on an IC. The IC is mounted on a substrate, such as FR-4, and coupled to a bond pad located on the substrate. The bond pad is coupled to a via that is embedded in the substrate. The IC, bond pad, via, and FR-4 substrate are singulated. The via is a singulated in such a manner that a portion of the surface area previously surrounded by the substrate is exposed. The exposed area of the via is subsequently mounted on a PCB.

These as well as other aspects and advantages will become apparent to those of ordinary skill in the art by reading the following detailed description, with reference where appropriate to the accompanying drawings. Further, it is understood that this summary is merely an example and is not intended to limit the scope of the claims.

BRIEF DESCRIPTION OF THE DRAWINGS

Certain examples are described below in conjunction with the appended drawing figures, wherein like reference numerals refer to like elements in the various figures, and wherein.

DETAILED DESCRIPTION

A method of fabricating a vertically, or perpendicularly, mountable integrated circuit (IC) package is presented. The fabricated IC package includes an IC that is mounted perpendicularly to a first printed circuit board (PCB). The IC package also has a minimized offset height. The method includes coupling the IC to a bond pad (on a second PCB) in contact with a via (embedded in the second PCB). The via, along with the IC and bond pad, are subsequently singulated. An exposed portion of the via is then used to mount the singulated device to the first PCB.

Figure 1A:
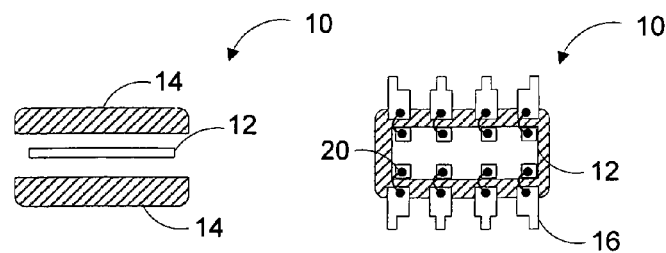
FIG. 1a is pictorial diagram of a Dual Inline Package (DIP)
Figure 1B:
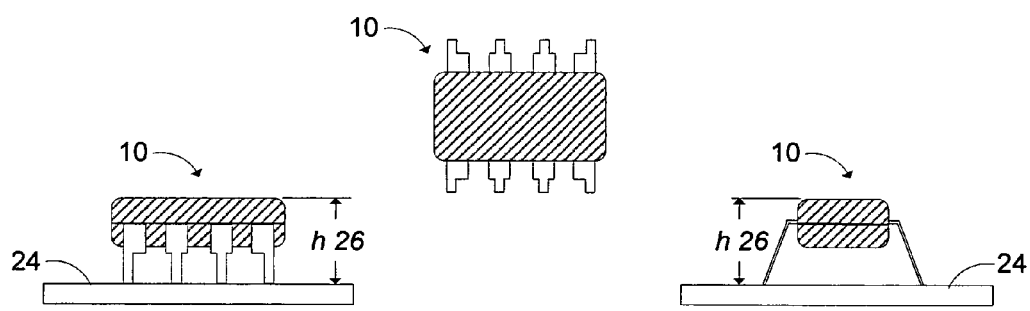
FIG. 1b is another pictorial diagram of a DIP.
Figure 1C:
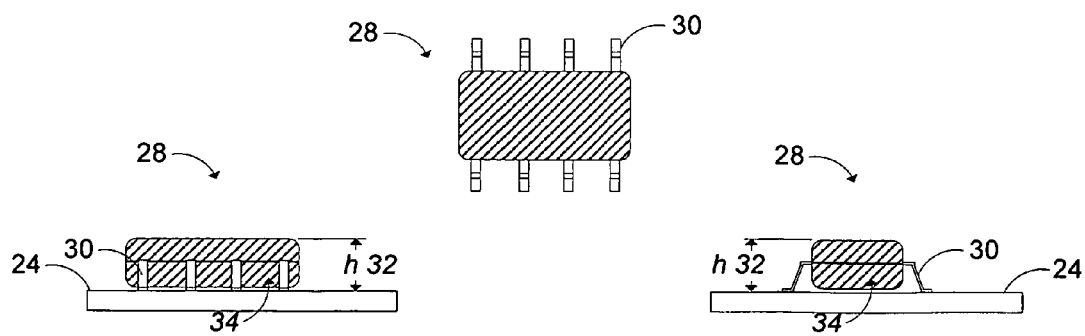
FIG. 1c is a pictorial diagram of a Small Outline Integrated Circuit (SOIC) package.
Figure 2:
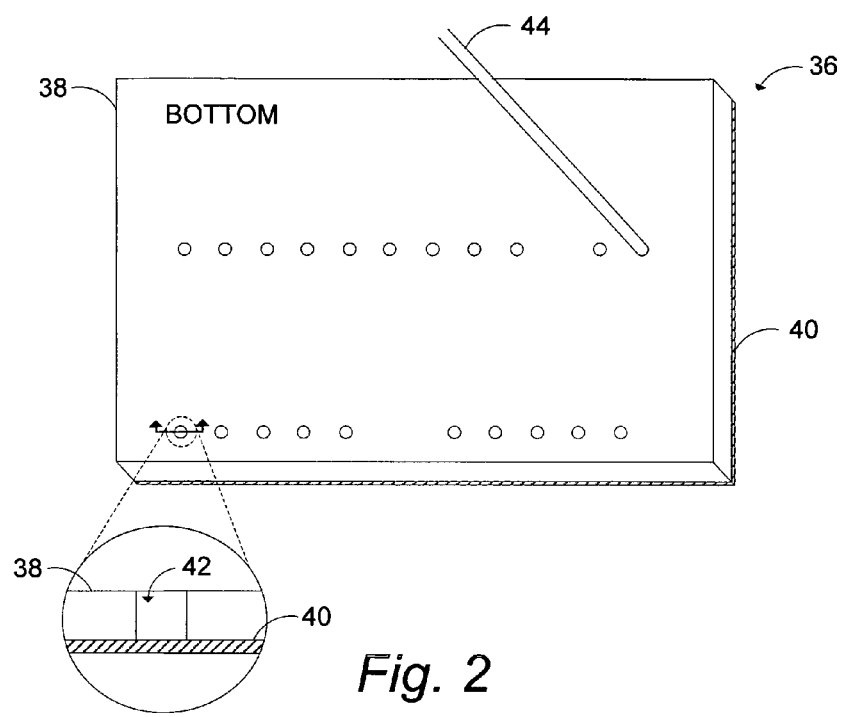
FIG. 2 is a pictorial diagram of a printed circuit board (PCB) with hole barrels.

Turning now to FIG. 2, an example PCB 36 is illustrated. The PCB 36 includes at least one dielectric substrate 38 (located on the bottom of the PCB 36) and at least one conductive layer 40 (located on the top of the PCB 36). The dielectric substrate 38 may be made of Flame Retardant, type 4, (FR-4) woven glass reinforced epoxy resin. The conductive layer may be a copper cladding layer (i.e., a rolled copper sheet) typically found on FR-4 substrates. Alternatively, the dielectric substrate may be a Bismaleimide Triazine (BT) based epoxy system. BT laminate substrates may be suitable for high frequency, low loss applications.

The vertically mountable IC is initially fabricated by forming a hole barrel 42 in the dielectric substrate 38. The bottom of the dielectric substrate 38 is first exposed to a focused laser 44. The laser 44 is used to remove, or ablate, dielectric material from the PCB 36. The areas of removed dielectric material, or hole barrels, become vias when they are filled in with subsequent metal plating processing. The laser may be coupled with a servo receiving commands from a software program. The software program may be programmed so at to determine the location of the hole barrels. In addition, other methods of forming the hole barrels are possible, such as chemical etching. Laser ablating, such as with a $CO_2$ laser, are more suitable, however, for providing hole barrel aspect ratios. After the hole barrels are formed, the PCB 36 may be put through a desmear process in order to remove dielectric material that became heated and melted into the hole barrel during the laser ablation.

The hole barrel 42 is subsequently "filled-in" with a conductive material such as copper. A variety of processes may be used for filling in the hole barrel 42. One such process is electroplating. The electroplating may be a Direct-Current (DC) or DC reverse current pulse plating type. The latter, DC reverse current pulse plating type, may be more suitable for filling in hole barrels with small aspect ratios. Once it is filled in, the hole barrel 42 is referred to as a via.

Figure 3:
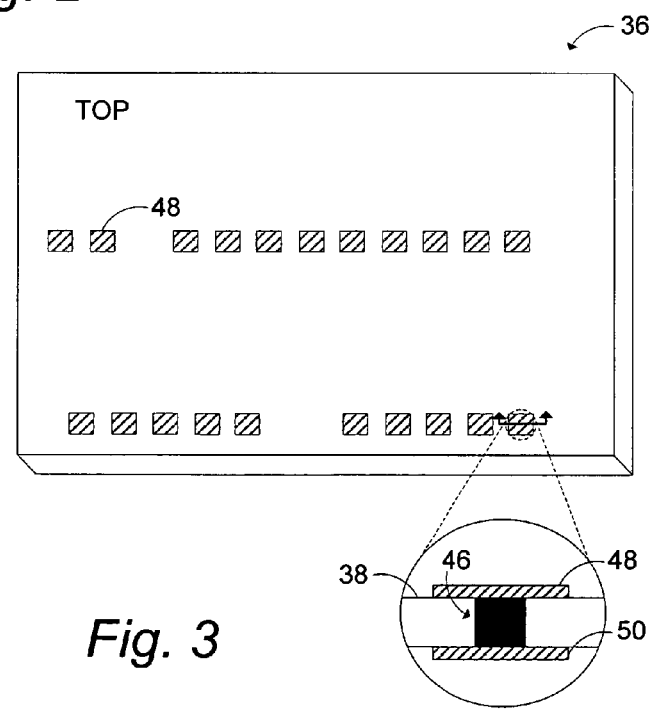
FIG. 3 is a pictorial diagram of a PCB with vias and bond pads.

FIG. 3 is an example diagram of a via 46 with bond pads formed on the top and bottom of the via 50. After the filling in of the hole barrel, excess material may be deposited on the dielectric on the bottom of the PCB 36. This excess material is etched in a wet or dry chemical etch process to form the bottom bond pad 50. Etching the excess material prevents all of the vias through PCB 36 from being electrically shorted together. A bond pad 48 is also formed by etching conductive layer 40 on the top of PCB 36. The top bond pad 48 provides a bondable surface. This bondable surface may be attached to with wire or metalized bump. The process of forming the top bond pad 48 may be completed prior to the vias being formed. Additionally, forming the top bond pads also creates areas on the dielectric substrate 38 that are mountable by an IC. An IC may be physically mounted to the top of the dielectric substrate 38 by an adhesive such as an epoxy based adhesive.

Figure 4:
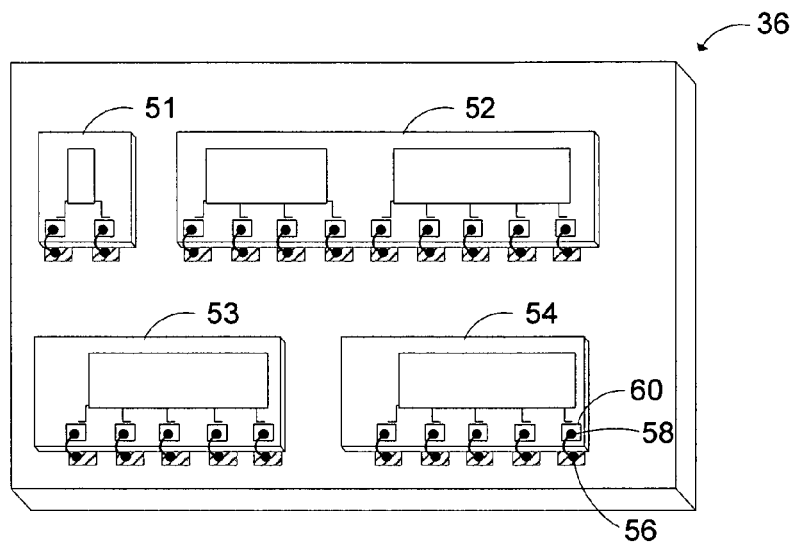
FIG. 4 is a pictorial diagram of a PCB with integrated circuits (ICs) mounted to the PCB and electrically coupled to bond pads.

In the example diagram of FIG. 4, four ICs 51-54 are mounted to the PCB 36. The ICs 51-54 are also wire and bump bonded to the top bond pads, such as bond pad 48, located on the top of PCB 36. The wire bonds may use a bump bonding technique, or other bonding techniques to electrically couple the IC with the top bond pads. Bump bonds 56 and 58 are respectively shown on bond pad 48 and bond pad 60 which is located on IC 54. The bonding of the ICs 51-54 to the top bond pads allows each IC to not only be electrically coupled with respective bond pads, but also allows each IC to be electrically coupled with the via that a respective bond pad is in physical contact with.

Figure 5:
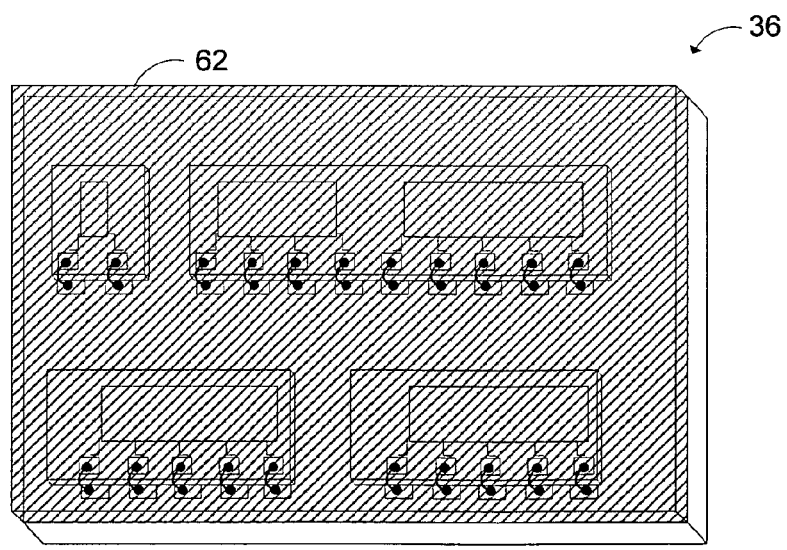
FIG. 5 is a pictorial diagram of a PCB with ICs encapsulated in a dielectric housing.

Subsequent to the ICs 51-54 being mounted and bonded, the ICs 51-54 and their associated bond pads and wire bonds may be encapsulated in a dielectric housing, or encapsulation layer. FIG. 5 is an example diagram illustrating a dielectric encapsulation layer 62. The dielectric encapsulation layer 62 provides a measure of physical protection and electrical isolation of the ICs, bond pads, and wire bonds it encapsulates. The encapsulation layer 62 does not need to be applied, or deposited, in this step of the fabrication. The encapsulation layer 62 may be deposited or a dielectric housing may be added at a subsequent fabrication step. The dielectric material used in the encapsulation layer 62 or dielectric housing may be plastic, ceramic, or any other type of appropriate electrically insulating material.

Figure 6:
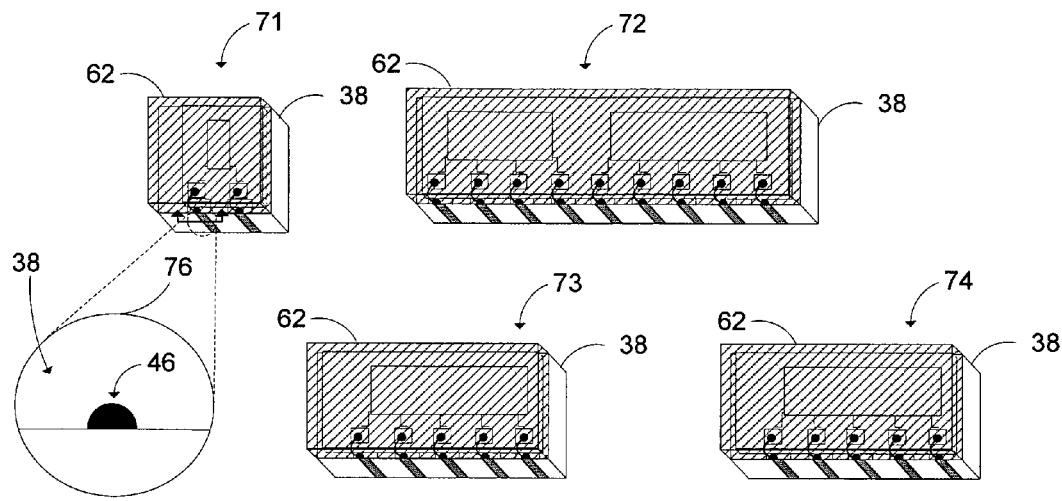
FIG. 6 is a pictorial diagram of singulated, vertically mountable, IC packages.

Regardless of whether or not the ICs 51-54 are encapsulated in a dielectric material, they are cut out, or singulated, to form individual IC packages as is illustrated the example diagram of FIG. 6. Each IC of ICs 51-54 is part of a respective vertically mountable IC package 71-74. It is in the singulation of IC packages 71-74 that they become vertically, or perpendicularly, mountable.

During singulation, the vias are cut through so that a portion of the via is exposed. Cross-sectional view 76 shows via 46 being semi-circular in nature after singulation. A first portion of the via 46 is exposed, a second portion is coupled with the top bond pad, and the rest of the via 46 is surround by dielectric 38. The via 46 may be singulated in a variety of ways in order to provide an exposed surface area. The exposed surface area of the vias becomes the mountable regions of IC packages 71-74. If a large surface area is required, the via 46 may be singulated so as to maximize the mountable surface area. Once singulated, the exposed portion of the via 46 may be treated with a solution to prevent oxidation and promote solderability. If, for example, the via is made of copper, it may be treated with an Organic Solderability Preservative (OSP) or other suitable electroless metal plating solution deposition.

Figure 7:
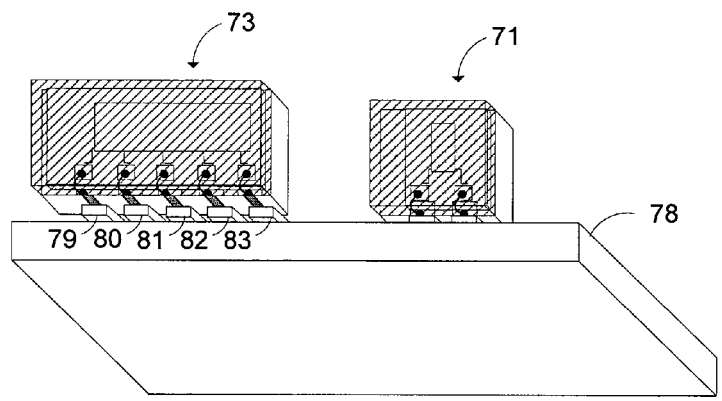
FIG. 7 is a pictorial diagram of vertically mountable IC packages mounted to a PCB.

FIG. 7 is an example diagram illustrating IC packages 71 and 73 being mounted to a PCB 78. The PCB 78 includes bond pads (or bond capture pads) 79-83. IC package 73 is mounted directly onto bond pads 79-83. Conventional bonding techniques may be used to bond the exposed surface area of the vias of IC package 73 to the bond pads 79-83. The vias of IC package 73 not only provide electrical coupling of IC 53 to the PCB 78 but also physical mounting of the IC package 73. The IC package 73 may also be reinforced by an adhesive or epoxy bond with the PCB 78 in order to strengthen the physical bond of the IC package 73 to the PCB 78. This reinforcement, however, is not required.

Figure 8:
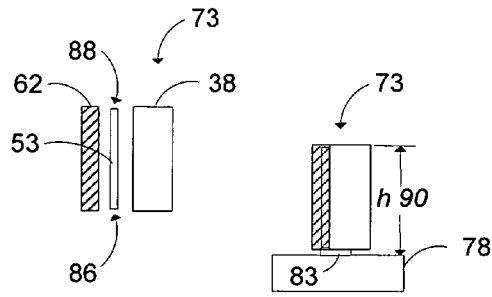
FIG. 8 is another pictorial diagram of vertically mountable IC packages.

Not only does the method of fabricating a vertically mountable IC package allow an IC to be mounted vertically on a PCB, it also reduces the offset height of the IC package from the PCB. In particular, it reduces or eliminates the dielectric encapsulation layer or dielectric housing contribution to the offset height. FIG. 8 is an example diagram of the IC package 73. The IC 53 is mounted vertically in between the dielectric layer 38 and the dielectric encapsulation layer 62. The bottom edge 86 of IC 53 may be aligned with the bottom edges of dielectric layer 38 and dielectric encapsulation layer 62. The top edge 88 of IC 53 may then be aligned with the top edges of dielectric layer 38 and dielectric encapsulation layer 62. The offset height 90, therefore, of the IC package 73 is determined by the size of the IC 53. If IC 53 is designed to be long laterally and short vertically, a third axis sensor of a 3-axis magnetic compass, for example, may be manufactured to fit in a compact electronic device that has stringent offset height requirements for the IC packages mounted on its respective PCBs.

Figure 9:
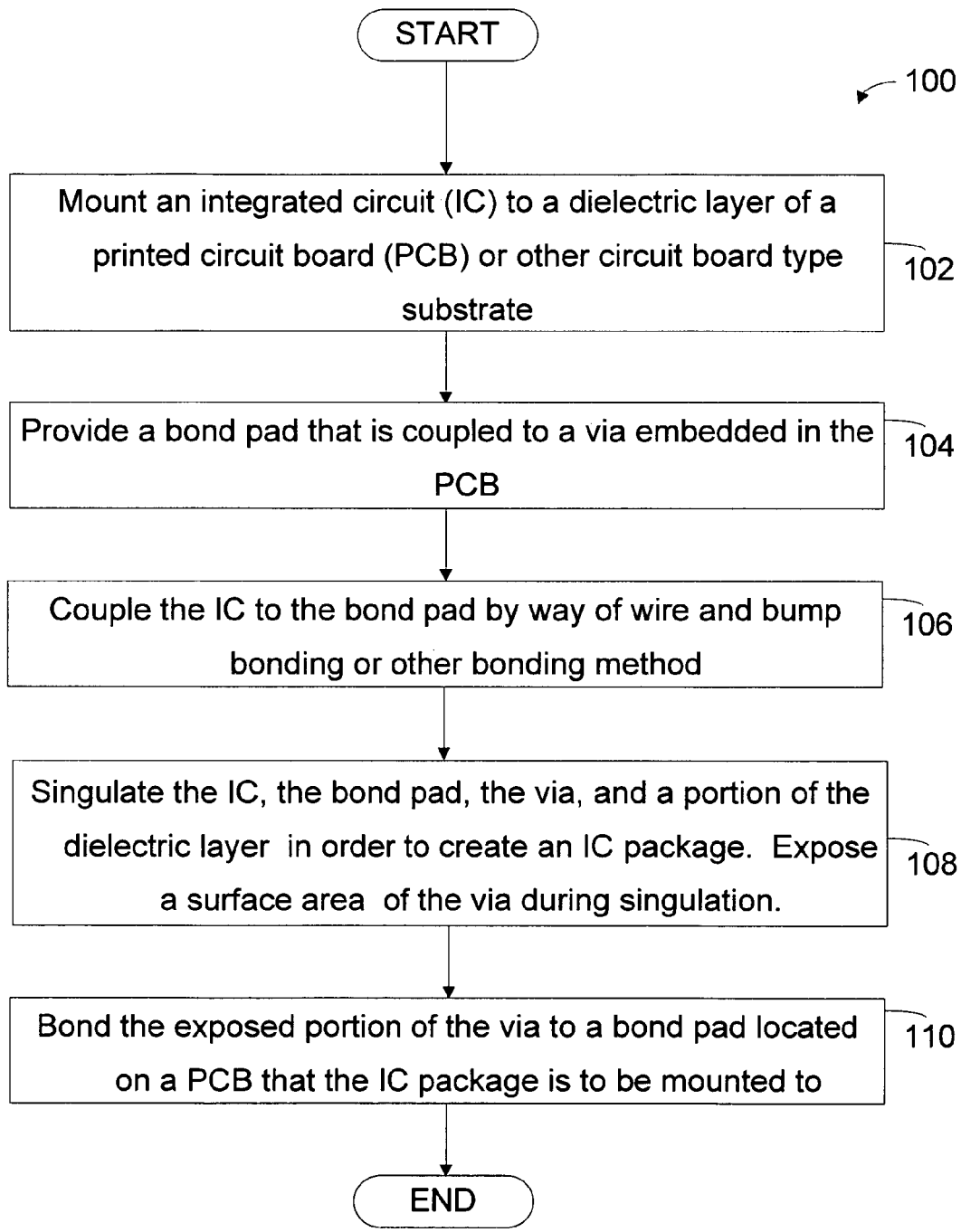
FIG. 9 is a block diagram of a method of fabricating a vertically mountable IC package.

The third axis sensor of a three axis magnetic sensor may be fabricated using the method 100 illustrated in FIG. 9. The first step of the method 100, as shown at block 102, is to mount the sensor to a circuit board, or a PCB. The sensor is then coupled to a bond pad located on the PCB, as shown at block 104. The bond pad is also coupled with a via that is set, or embedded, in the PCB. The via may go all the way through the PCB, or only a portion of the PCB. The sensor is then coupled to the bond pad by way of a wire and bump bond from the sensor to the bond pad, as shown at block 106. At block 108, the sensor is singulated into a sensor package. The via, that the bond pad is coupled to, is sliced through during singulation so that a surface area of the via is exposed. The sensor package may then be mounted to a second PCB by mounting a portion of the exposed surface area to a bond pad located on the second PCB, as shown at block 110.

Overall, the above examples describe a method of fabricating a vertically mountable IC package. The method includes singulating, or cutting through a via that is embedded in a circuit board. The exposed portion of the via is used as a mountable and bondable surface for the vertically mountable IC package. It should be understood that the illustrated examples are examples only and should not be taken as limiting the scope of the present invention. The claims should not be read as limited to the described order or elements unless stated to that effect. Therefore, all examples that come within the scope and spirit of the following claims and equivalents thereto are claimed as the invention.

We claim:

1. A method of fabricating a vertically mountable integrated circuit (IC) package, the method comprising:
    providing a substrate that comprises a conductive layer and a dielectric layer, the dielectric layer having a top and a bottom, and the conductive layer being located on the top of the dielectric layer;
    creating a via through the bottom of the dielectric layer, the via being in physical contact with the conductive layer;
    forming a bond pad in the conductive layer that is coupled with the via, the bond pad having a bondable surface;
    mounting the IC onto a mountable portion of the dielectric layer;
    bonding the IC onto the surface of the bond pad by way of a wire bond; and
    singulating the via, the IC, the bond pad, and a portion of the dielectric layer so as to create an IC package, singulating comprising cutting through the via cross-sectionally so as to provide a surface area that is electrically coupled to the IC.

2. The method as in claim 1, further comprising encapsulating the IC, the bond pad, the wire bond, and the portion of the dielectric layer in a dielectric housing so as to protect and electrically isolate the IC, the bond pad, and the wire bond.

3. The method as in claim 1, wherein the substrate is a Flame Retardant, type 4, (FR-4) substrate.

4. The method as in claim 1, wherein the substrate is Bismaleimide Triazine (BT) laminate substrate.

5. The method as in claim 3, wherein the conductive layer and the via are copper.

6. The method as in claim 5, further comprising treating the exposed area of the via with an electroless metal plating solution deposition.

7. The method as in claim 6, wherein the electroless metal plating solution is an Organic Solderability Preservative (OSP).

8. The method as in claim 1, wherein creating the via through the bottom of the dielectric layer comprises:
    exposing the bottom of the dielectric layer to a laser;
    ablating the dielectric layer with the laser thereby creating a hole barrel through the dielectric layer; and
    depositing an electrically conductive material in the hole barrel that is in physical contact with the conductive layer.

9. The method as in claim 8, wherein the laser is a $CO_2$ laser.

10. The method as in claim 8, wherein depositing an electrically conductive material comprises electroplating the electrically conductive material onto the surface of the hole barrel.

11. The method as in claim 10, wherein the electroplating is a DC reverse current pulse plating type.

12. The method as in claim 1, further comprising mounting the IC package to a second PCB, mounting comprising coupling a bond pad located on the second PCB to a portion of the surface area of the via.

13. A method of mounting an integrated circuit (IC) vertically to a circuit board, the method comprising:
    mounting the IC on a dielectric substrate;
    coupling the IC with a bond pad located on the dielectric substrate;
    coupling the bond pad with a via, the via being embedded in the substrate;
    singulating the via, the IC, the bond pad, and a portion of the dielectric substrate so as to create an IC package, thereby exposing a surface area of the embedded via; and
    bonding a portion of the surface area of the via to a bond capture pad located on the circuit board.

14. The method as in claim 13, further comprising encapsulating the IC and the bond pad located on the dielectric substrate in a dielectric housing, the dielectric housing providing electrical isolation and physical protection to the IC and the bond pad located on the dielectric substrate.

15. The method as in claim 13, wherein the dielectric substrate is a Flame Retardant, type 4, (FR-4) substrate.

16. The method as in claim 13, wherein the substrate is Bismaleimide Triazine (BT) laminate substrate.

17. The method as in claim 13, wherein the via and the bond pad located on the dielectric substrate are copper.

18. The method as in claim 13, wherein exposing the surface area of the via comprises cutting through the via cross-sectionally.

* * * * *